(12) United States Patent
Herner et al.

(10) Patent No.: US 7,745,312 B2
(45) Date of Patent: Jun. 29, 2010

(54) SELECTIVE GERMANIUM DEPOSITION FOR PILLAR DEVICES

(75) Inventors: S. Brad Herner, San Jose, CA (US); Christopher J. Petti, Mountain View, CA (US)

(73) Assignee: Sandisk 3D, LLC, Milpitas, CA (US)

( * ) Notice: Subject to any disclaimer, the term of this patent is extended or adjusted under 35 U.S.C. 154(b) by 73 days.

(21) Appl. No.: 12/007,780

(22) Filed: Jan. 15, 2008

(65) Prior Publication Data

US 2009/0181515 A1  Jul. 16, 2009

(51) Int. Cl.
    *H01L 21/20*  (2006.01)
(52) U.S. Cl. .................. 438/479; 438/249; 438/253; 438/257; 438/283; 438/299; 257/295; 257/300; 257/302; 257/330; 257/E21.576; 257/E21.581
(58) Field of Classification Search .................. 438/249, 438/561
    See application file for complete search history.

(56) References Cited

U.S. PATENT DOCUMENTS

| 5,891,778 | A | 4/1999 | Wen |
| 5,915,167 | A | 6/1999 | Leedy |
| 5,937,280 | A | 8/1999 | Wen |
| 6,429,449 | B1 | 8/2002 | Gonzalez et al. |
| 6,750,091 | B1 | 6/2004 | Gonzalez et al. |
| 7,285,464 | B2 | 10/2007 | Herner et al. |
| 2002/0163027 | A1* | 11/2002 | Skotnicki et al. ............ 257/302 |
| 2004/0157354 | A1* | 8/2004 | Kuriyama et al. ............. 438/45 |
| 2005/0012119 | A1 | 1/2005 | Herner et al. |
| 2005/0052915 | A1* | 3/2005 | Herner et al. ............... 365/202 |
| 2005/0062079 | A1 | 3/2005 | Wu et al. |
| 2005/0098800 | A1 | 5/2005 | Herner et al. |
| 2006/0087005 | A1 | 4/2006 | Herner |
| 2006/0284237 | A1 | 12/2006 | Park et al. |
| 2006/0292301 | A1 | 12/2006 | Herner |
| 2007/0086235 | A1 | 4/2007 | Kim et al. |
| 2007/0090425 | A1* | 4/2007 | Kumar et al. ............... 257/295 |
| 2007/0164309 | A1 | 7/2007 | Kumar et al. |
| 2008/0078984 | A1 | 4/2008 | Park et al. |

FOREIGN PATENT DOCUMENTS

| JP | 04 067671 | 3/1992 |
| JP | 06 334139 | 12/1994 |
| KR | 100766504 B1 | 10/2007 |
| WO | WO 2007/067448 A1 | 6/2007 |

OTHER PUBLICATIONS

U.S. Appl. No. 11/444,936, filed Apr. 31, 2006, Radigan et al.
U.S. Appl. No. 11/819,078, filed Jun. 25, 2007, Herner.
Herner, S.B., "Low Temperature Deposition and Crystallization of Large-Grained Ge Films on TiN", Electrochemical and Solid-State Letters, vol. 9(5), (2006), pp. G161-G163.

(Continued)

*Primary Examiner*—N Drew Richards
*Assistant Examiner*—Kyoung Lee
(74) *Attorney, Agent, or Firm*—Foley & Lardner LLP

(57) ABSTRACT

A method of making a pillar device includes providing an insulating layer having an opening, and selectively depositing germanium or germanium rich silicon germanium semiconductor material into the opening to form the pillar device.

33 Claims, 4 Drawing Sheets

OTHER PUBLICATIONS

Herner, S.B. et al., "Homogeneous Tungsten Chemical Vapor Deposition on Silane Pretreated Titanium Nitride", Electrochemical and Solid-State Letters, vol. 2(8), (1999), pp. 398-400.

International Search Report and Written Opinion, mailed Jun. 5, 2009, received in International Application No. PCT/US2009/030937.

* cited by examiner

~400Å thick Ge deposited on TiN no Ge deposited on $SiO_2$

SELECTIVE GERMANIUM DEPOSITION FOR PILLAR DEVICES

FIELD OF THE INVENTION

The present invention relates generally to the field of semiconductor device processing, and specifically to a method of making a nonvolatile memory device.

BACKGROUND

Herner et al., U.S. patent application Ser. No. 10/955,549 filed Sep. 29, 2004 (which corresponds to US Published Application 2005/0052915 A1), hereby incorporated by reference, describes a three dimensional memory array in which the data state of a memory cell is stored in the resistivity state of the polycrystalline semiconductor material of a pillar shaped semiconductor junction diode. A subtractive method is used to fabricate such pillar diode devices. This method includes depositing one or more silicon, germanium or other semiconductor material layers. The deposited semiconductor layer or layers are then etched to obtain semiconductor pillars. A $SiO_2$ layer can be used as a hard mask for the pillar etching and removed afterwards. Next, $SiO_2$ or other gap fill dielectric material is deposited in between and on top of the pillars. A chemical mechanical polishing (CMP) or etchback step is then conducted to planarize the gap fill dielectric with the upper surface of the pillars.

For additional description of the subtractive pillar fabrication process, see Herner et al., U.S. patent application Ser. No. 11/015,824, "Nonvolatile Memory Cell Comprising a Reduced Height Vertical Diode," filed Dec. 17, 2004 and U.S. patent application Ser. No. 11/819,078 filed Jul. 25, 2007. However, in the subtractive method, the height of the semiconductor pillar may be limited by thin and soft photoresist used as the etching mask. The photoresist mask material etches at a slower rate than the semiconductor material, but etches nonetheless, and some mask material must remain when the semiconductor etch is completed. The oxide gap filling step after pillar etch presents a processing challenge when the aspect ratios of the openings between the pillars increases and/or the CMP process or etchback of the gap fill layer removes a significant thickness of the deposited semiconductor material.

SUMMARY

One embodiment of this invention provides a method of making a pillar device which includes providing an insulating layer having an opening, and selectively depositing germanium or germanium rich silicon germanium semiconductor material into the opening to form the pillar device.

DETAILED DESCRIPTION OF THE PREFERRED EMBODIMENTS

Figure 1A:
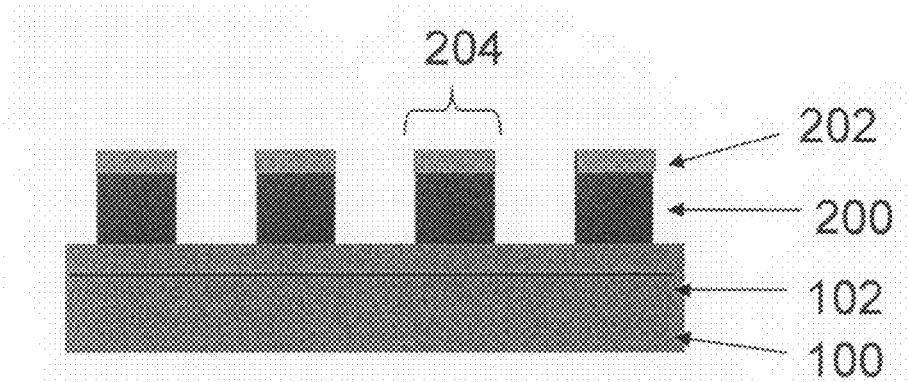
FIGS. 1a to 1d are side cross-sectional views illustrating stages in formation of a pillar device according to an embodiment of the present invention.

One embodiment of the invention provides a method of making a pillar device by selectively depositing a germanium or germanium rich silicon germanium pillar into previously formed opening in an insulating layer to overcome the limitations of the subtractive method used in the prior art. The selective deposition method preferably includes providing an electrically conductive material, such as titanium nitride, tungsten, or another conductor, exposed in the opening in the insulating layer. A silicon seed layer is then deposited on the titanium nitride. The germanium or germanium rich silicon germanium (i.e., SiGe containing more than 50 atomic percent Ge) is then selectively deposited on the silicon seed layer in the opening, while no germanium or germanium rich silicon germanium is deposited on the upper surface of the insulating layer. This eliminates the oxide CMP or etchback step that is used in the subtractive method. Preferably, the silicon seed layer and the germanium or germanium rich silicon germanium pillar are deposited by chemical vapor deposition at a low temperature, such as a temperature below 440° C.

The electrically conductive material, such as titanium nitride, can be provided in the opening by any suitable method. For example, in one embodiment, a titanium nitride layer is formed over a substrate and then photolithographically patterned into a pattern. Alternatively, other materials, such as titanium tungsten or tungsten nitride may be used instead of titanium nitride. The pattern may comprise an electrode, such as a rail shaped electrode. An insulating layer is then formed on the titanium nitride pattern, such as on the titanium nitride electrode. Then, the opening is formed in the insulating layer by etching to expose the titanium nitride pattern. In an alternative embodiment, the conductive nitride pattern is selectively formed in an opening in an insulating layer. For example, a titanium nitride or tungsten nitride pattern may be selectively formed in the opening in an insulating layer by nitriding a titanium or tungsten layer exposed at the bottom of the opening.

The pillar device may comprise a portion of any suitable semiconductor device, such as a diode, transistor, etc. Preferably, the pillar device comprises a diode, such as a p-i-n diode. In this embodiment, the step of selectively depositing germanium or germanium rich silicon germanium semiconductor material into the opening comprises selectively depositing first conductivity type (such as n-type) semiconductor material, followed by selectively depositing intrinsic germanium or germanium rich silicon germanium semiconductor material, followed by selectively depositing second conductivity type (such as p-type) germanium or germanium rich silicon germanium semiconductor material into the opening to form the p-i-n diode. Thus, all three regions of a p-i-n diode are selectively deposited into the opening. Alternatively, in a less preferred embodiment, rather than selectively depositing the second conductivity type semiconductor material, the diode is completed by implanting second conductivity type dopants, such as p-type dopants, into an upper portion of the intrinsic germanium or germanium rich silicon germanium semiconductor material to form the p-i-n diode. Of course, the position of the p-type and n-type regions can be reversed if desired. To form a p-n type diode, a first conductivity type (such as n-type) germanium or germanium rich silicon germanium semiconductor material is selectively deposited into the opening, followed by selectively depositing a second conductivity type (such as p-type) germanium or germanium rich silicon germanium semiconductor material over the first conductivity type semiconductor material to form the diode.

FIGS. 1a through 1d show a preferred method of forming the pillar device using selective deposition.

Referring to FIG. 1a, the device is formed over a substrate 100. The substrate 100 can be any semiconducting substrate known in the art, such as monocrystalline silicon, IV-IV compounds such as silicon-germanium or silicon-germanium-carbon, III-V compounds, II-VI compounds, epitaxial layers over such substrates, or any other semiconducting or non-semiconducting material, such as glass, plastic, metal or ceramic substrate. The substrate may include integrated circuits fabricated thereon, such as driver circuits for a memory device. An insulating layer 102 is preferably formed over substrate 100. The insulating layer 102 can be silicon oxide, silicon nitride, high-dielectric constant film, Si—C—O—H film, or any other suitable insulating material.

A first electrically conductive layer 200 is formed over the substrate 100 and insulating layer 102. The conductive layer 200 can comprise any conducting material known in the art, such as tungsten and/or other materials, including aluminum, tantalum, titanium, copper, cobalt, or alloys thereof. An adhesion layer may be included between the insulating layer 102 and the conductive layer to help conductive layer adhere to insulating layer 102.

A barrier layer 202, such as a TiN layer is deposited on top of the first conductive layer 200. If upper surface of the first conductive layer 200 is tungsten, then tungsten nitride can be formed on top of the conductive layer 200 instead of TiN by nitriding the upper surface of the tungsten. For example, the following conductive layer combinations may be used: Ti (bottom)/Al/TiN (top), or Ti/TiN/Al/TiN, or Ti/Al/TiW, or any combination of these layers. The bottom Ti or Ti/TiN layers can act as adhesion layers, the Al layer can act as the conductive layer 200, and the TiN or TiW layer on top can serve as the barrier layer 202 as well as an antireflective coating for patterning the electrodes 204, as an optional polish stop material for subsequent CMP of an insulating layer 108 (if layer 108 is deposited in two steps), and as a selective silicon seed deposition substrate, as will be described below.

Finally, the conductive layer 200 and the barrier layer 202 are patterned using any suitable masking and etching process. In one embodiment, a photoresist layer is deposited over the barrier layer 202, patterned by photolithography, and the layers 200 and 202 are etched using the photoresist layer as a mask. The photoresist layer is then removed using standard process techniques. The resulting structure is shown in FIG. 1a. The conductive layer 200 and the barrier layer 202 may be patterned into rail shaped bottom electrodes 204 of memory devices. Alternatively, the electrodes 204 may instead be formed by a Damascene method, in which at least the conductive layer 200 is formed in grooves in an insulating layer by deposition and subsequent planarization.

Figure 1B:
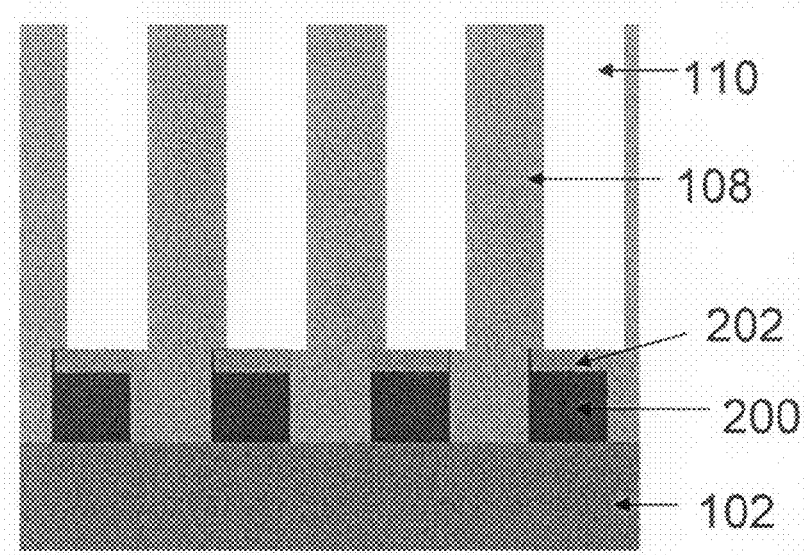

Next, turning to FIG. 1b, an insulating layer 108 is deposited over and between electrodes 204. The insulating layer 108 can be any electrically insulating material, such as silicon oxide, silicon nitride, or silicon oxynitride. The insulating layer 108 may be deposited in one step and then planarized by CMP for a desired amount of time to obtain a planar surface. Alternatively, the insulating layer 108 may be deposited as two separate sublayers, where a first sublayer is formed between the electrodes 204 and a second sublayer is deposited over the first sublayer and over the electrodes 204. A first CMP step may be used to planarize the first sublayer using barrier layer 202 as polish stop. A second CMP step may be used to planarize the second sublayer for a desired amount of time to obtain a planar surface.

Figure 1C:
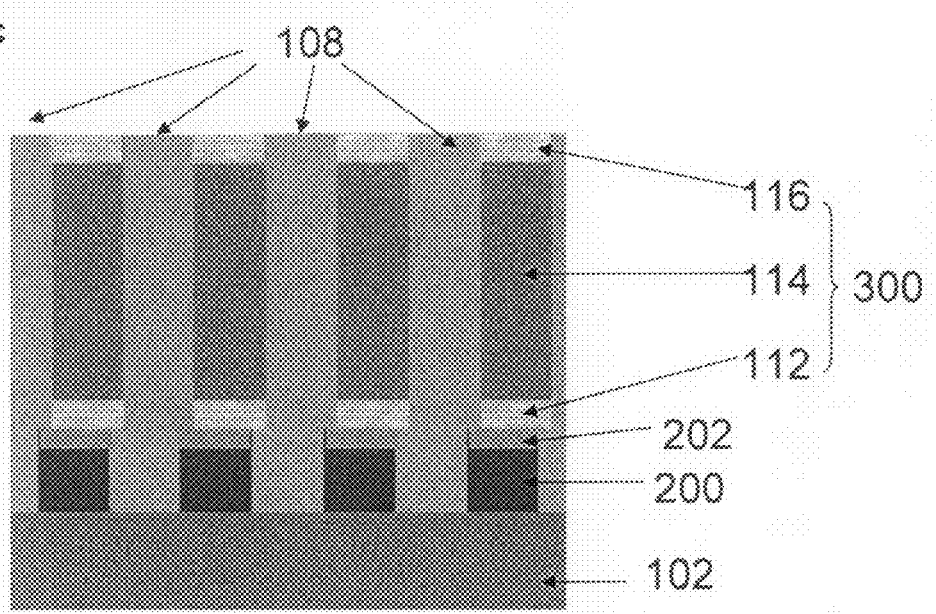

The insulating layer 108 is then photolithographically patterned to form openings 110 extending to and exposing the upper surface of the barriers 202 of the electrodes 204. The openings 110 should have about the same pitch and about the same width as the electrodes 204 below, such that each semiconductor pillar 300 shown FIG. 1c is formed on top of a respective electrode 204. Some misalignment can be tolerated. The resulting structure is shown in FIG. 1b.

Referring to FIG. 1c, vertical semiconductor pillars 300 are selectively formed in the openings 110 above the TiN barrier 202. The semiconductor material of the pillars can be germanium or a germanium rich silicon germanium. For simplicity, this description will refer to the semiconductor material as germanium, but it will be understood that the skilled practitioner may select other suitable materials instead.

Germanium pillars 300 can be selectively deposited by low pressure chemical vapor deposition (LPCVD) selectively on a thin Si seed layer located over TiN barriers, as shown in FIG. 1c. For example, the method described in U.S. application Ser. No. 11/159,031 filed on Jun. 22, 2005 (which published as US Published Application 2006/0292301 A1), incorporated herein by reference, may be used to deposit the Ge pillars. Preferably, the entire pillar 300 is selectively deposited. However, in a less preferred embodiment, only about the first 20 nm of the pillar 300 deposited on the seed layer/TiN barrier needs to have high selectivity versus silicon dioxide to prevent sidewall shorting of the diode, while the remainder of the pillar can be non-selectively deposited.

Figure 2A:
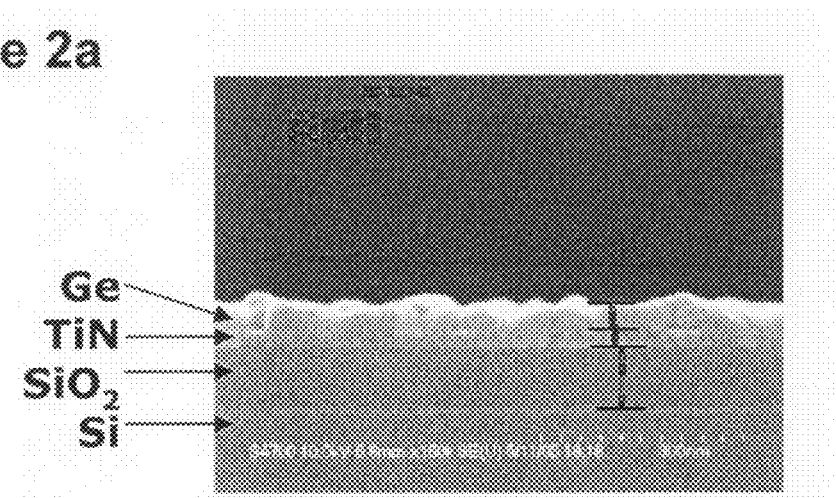
FIG. 2a is a cross-sectional SEM image of an about 40 nm thick Ge film deposited by $GeH_4$ decomposition at 380° C. and 1 torr for 10 min on a silicon seed film which was deposited by $SiH_4$ decomposition on TiN at 380° C. and 1 torr for 60 min.
Figure 2B:
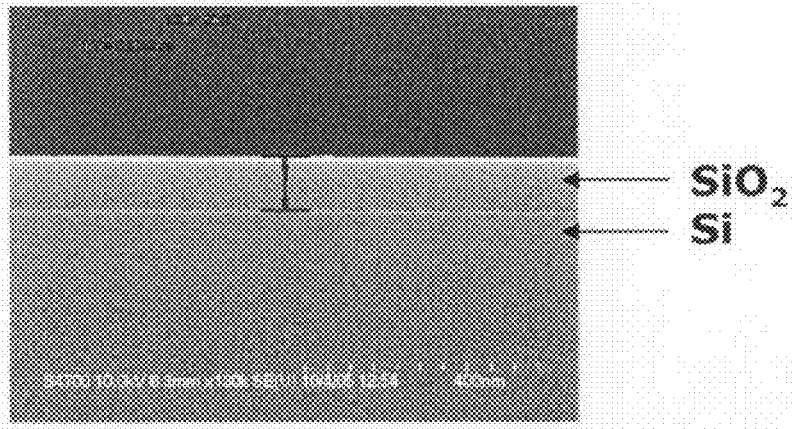
FIG. 2b is a cross-sectional SEM image of a $SiO_2$ surface after the same two step $SiH_4$ and $GeH_4$ CVD treatment. No Ge deposition on $SiO_2$ was observed.

For example, as shown in FIG. 2a, a thin Si seed layer is deposited on TiN by flowing 500 sccm of $SiH_4$ for 60 min at 380° C. and a pressure of 1 Torr. Silane flow is then halted, and 100 sccm of $GeH_4$ is flowed at the same temperature and pressure to deposit Ge. Ge may be deposited at a temperature below 380° C., such as 340° C. for example. The SEM image in FIG. 2a shows that after a 10 min. deposition, about 40 nm of germanium was selectively deposited on the Si seed layer located on a TiN layer. As shown in FIG. 2b, no germanium deposition on the $SiO_2$ surface is observed when the TiN layer is omitted. By using a two step deposition with both steps conducted at a temperature of 380° C. or less, Ge can be selectively deposited on TiN and not on adjacent $SiO_2$ surfaces. An example of a two step deposition of a planar Ge film is described in S. B. Herner, *Electrochemical and Solid-State Letters*, 9 (5) G161-G163 (2006), which is incorporated herein by reference. Preferably, the silicon seed layer is deposited at a temperature below 440° C. and the germanium pillar is deposited at a temperature below 400° C.

In preferred embodiments, the pillar comprises a semiconductor junction diode. The term junction diode is used herein to refer to a semiconductor device with the property of non-ohmic conduction, having two terminal electrodes, and made of semiconducting material which is p-type at one electrode and n-type at the other. Examples include p-n diodes and n-p diodes, which have p-type semiconductor material and n-type semiconductor material in contact, such as Zener diodes, and p-i-n diodes, in which intrinsic (undoped) semiconductor material is interposed between p-type semiconductor material and n-type semiconductor material.

Bottom heavily doped region 112 of the diode 300 can be formed by selective deposition and doping. The germanium can be deposited and then doped, but is preferably doped in situ by flowing a dopant containing gas providing n-type dopant atoms, for example phosphorus (i.e., in the form of phosphine gas added to the germane gas) during selective CVD of the germanium. Heavily doped region 112 is preferably between about 10 and about 80 nm thick.

Intrinsic diode region 114 can then be formed by the selective CVD method. The intrinsic region 114 deposition can be conducted during a separate CVD step or by turning off the flow of the dopant gas, such as phosphine, during the same CVD step as the deposition of region 112. The intrinsic region 114 may be between about 110 and about 330 nm, preferably about 200 nm thick. An optional CMP process can then be conducted to remove any bridged intrinsic germanium on top of the insulating layer 108, and to planarize the surface preparing for the following lithography step. The p-type top region 116 is then formed by the selective CVD method. The p-type top region 116 deposition can be conducted during a separate CVD step from the region 114 deposition step, or by turning on the flow of the dopant gas, such as boron trichloride, during the same CVD step as the region 114 deposition step. The p-type region 116 may be between about 10 and about 80 nm thick. An optional CMP process can then be conducted to remove any bridged p-type germanium on top of the insulating layer 108, and to planarize the surface preparing for the following lithography step. Alternatively, the p-type region 116 may be formed by ion implantation into the upper region of the intrinsic region 114. The p-type dopant is preferably boron or $BF_2$. The formation of the p-type region 116 completes formation of pillar shaped diodes 300. The resulting structure is shown in FIG. 2c.

In the illustrative example, the bottom region 112 is $N^+$ (heavily doped n-type), and the top region 116 is $P^+$. However, the vertical pillar can also comprise other structures. For example, bottom region 112 can be $P^+$ with $N^+$ top region 116. In addition, the middle region can intentionally be lightly doped, or it can be intrinsic, or not intentionally doped. An undoped region will never be perfectly electrically neutral, and will always have defects or contaminants that cause it to behave as if slightly n-doped or p-doped. Such a diode can be considered a p-i-n diode. Thus, a $P^+/N^-/N^+$, $P^+/P^-/N^+$, $N^+/N^-/P^+$ or $N^+/P^-/P^+$ diode can be formed.

The pitch and width of the pillars 300 are defined by the openings 110, and can be varied as desired. In one preferred embodiment, the pitch of the pillars (the distance from the center of one pillar to the center of the next pillar) is about 300 nm, while the width of a pillar varies between about 100 and about 150 nm. In another preferred embodiment, the pitch of the pillars is about 260 nm, while the width of a pillar varies between about 90 and 130 nm. In general, the pillars 300 preferably have a substantially cylindrical shape with a circular or roughly circular cross section having a diameter of 250 nm or less.

Figure 1D:
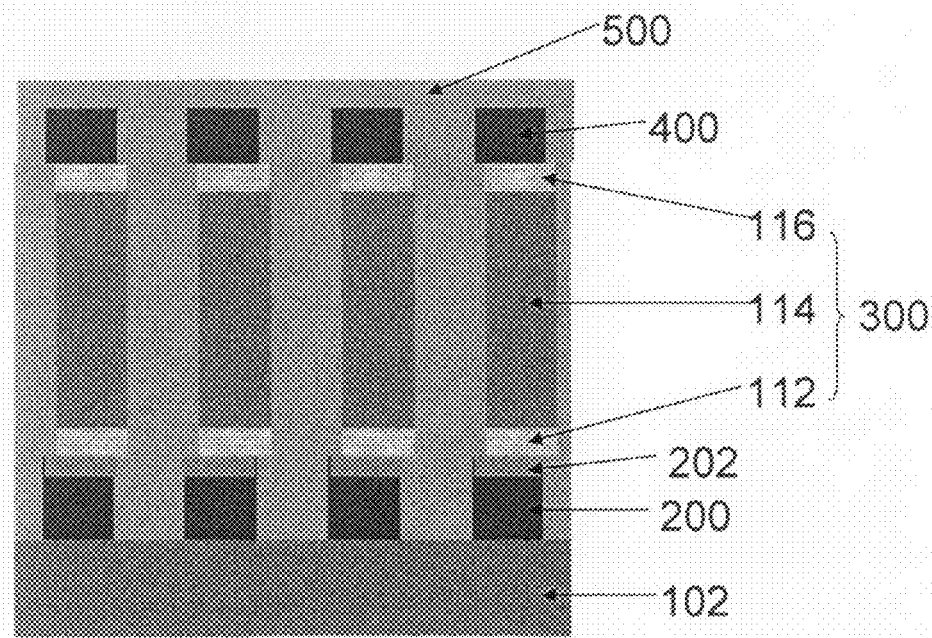

Turning to FIG. 1d, upper electrodes 400 can be formed in the same manner as the bottom electrodes 204, for example by depositing as Ti (bottom)/Al/TiN (top), or Ti/TiN/Al/TiN, or Ti/Al/TiW, or any combination of these layers. The TiN or TiW layer on top can serve as an antireflective coating for patterning the conductor and as a polish stop material for subsequent CMP of an insulating layer 500, as will be described below. The conductive layers described above are patterned and etched using any suitable masking and etching technique to form substantially parallel, substantially coplanar conductor rails 400, extending perpendicular to conductor rails 204. In a preferred embodiment, photoresist is deposited, patterned by photolithography and the layers etched, and then the photoresist removed using standard process techniques. Alternatively, an optional insulating oxide, nitride, or oxynitride layer may be formed on heavily doped regions 116 and the conductors 400 are formed by a Damascene process, as described in Radigan et al., U.S. patent application Ser. No. 11/444,936, "Conductive Hard Mask to Protect Patterned Features During Trench Etch," filed May 31, 2006, hereby incorporated by reference in its entirety.

Figure 1E:
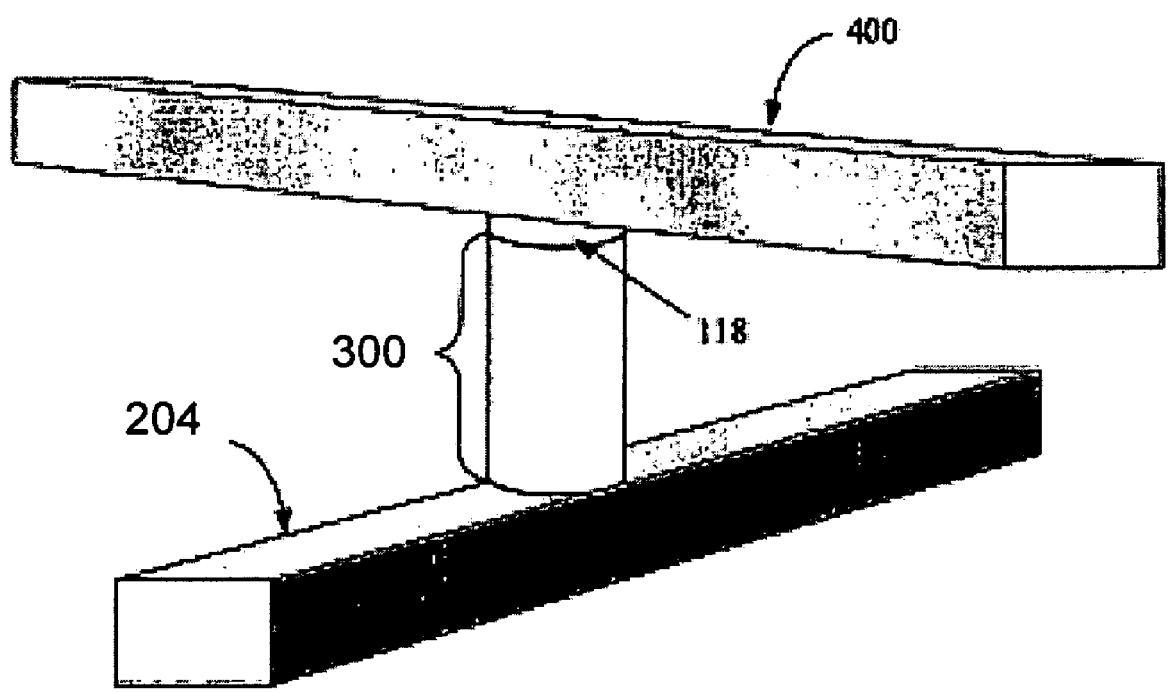
FIG. 1e is a three dimensional view of a completed pillar device according to an embodiment of the present invention.

Next, another insulating layer 500 is deposited over and between conductor rails 400. The layer 500 material can be any known electrically insulating material, such as silicon oxide, silicon nitride, or silicon oxynitride. In a preferred embodiment, silicon oxide is used as this insulating material. This insulating layer can be planarized with the upper surface of the conductor rails 400 by CMP or etchback. A three dimensional view of the resulting device is shown in FIG. 1e.

In the above description, the barrier layer 202 was formed before the insulating layer 108 is deposited. Alternatively, the sequence of the fabrication steps can be altered. For example, the insulating layer 108 with openings can be formed on the conductors 204 first, before selectively forming a tungsten nitride pattern in the opening to facilitate later germanium or germanium rich silicon germanium deposition.

The pillar device, such as a diode device, may comprise a one-time programmable (OTP) or re-writable nonvolatile memory device. For example, each diode pillar 300 may act as a steering element of a memory cell and another material or layer 118 which acts as a resistivity switching material (i.e., which stores the data) is provided in series with the diode 300 between the electrodes 204 and 400, as shown in FIG. 1e. Specifically, FIG. 1e shows one nonvolatile memory cell which comprises the pillar diode 300 in series with the resistivity switching material 118, such as an antifuse (i.e., antifuse dielectric), fuse, polysilicon memory effect material, metal oxide (such as nickel oxide, perovskite materials, etc,), carbon nanotubes, phase change materials, switchable complex metal oxides, conductive bridge elements, or switchable polymers. The resistivity switching material 118, such as a thin silicon oxide antifuse dielectric layer may be deposited over the diode pillar 300 followed by the deposition of the upper electrode 400 on the antifuse dielectric layer. Alternatively, the resistivity switching material 118 may be located below the diode pillar 300, such as between conductive layers 200 and 202. In this embodiment, a resistivity of the resistivity switching material 118 is increased or decreased in response to a forward and/or reverse bias provided between the electrodes 204 and 400.

In another embodiment, the pillar diode 300 itself may be used as the data storage device. In this embodiment, the resistivity of the pillar diode 300 is varied by the application of a forward and/or reverse bias provided between the electrodes 204 and 400, as described in U.S. patent application Ser. No. 10/955,549 filed Sep. 29, 2004 (which corresponds to US Published Application 2005/0052915 A1) and U.S. patent application Ser. No. 11/693,845 filed Mar. 30, 2007 (which corresponds to US Published Application 2007/0164309 A1), both of which are incorporated by reference in their entirety. In this embodiment, the resistivity switching material 118 may be omitted if desired.

Formation of a first memory level has been described. Additional memory levels can be formed above this first memory level to form a monolithic three dimensional memory array. In some embodiments, conductors can be shared between memory levels; i.e. top conductor 400 would serve as the bottom conductor of the next memory level. In other embodiments, an interlevel dielectric (not shown) is formed above the first memory level, its surface planarized, and construction of a second memory level begins on this planarized interlevel dielectric, with no shared conductors.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No.

5,915,167, "Three dimensional structure memory." The substrates may be thinned or removed from the memory levels before bonding, but as the memory levels are initially formed over separate substrates, such memories are not true monolithic three dimensional memory arrays. In contrast to the process described in Leedy, in an embodiment of the present invention, diodes share a conducting wire or electrode between two adjacent layers. In this configuration, the "bottom" diode will "point" in the opposite direction of the diode in the "upper" layer (i.e., the same conductivity type layer of each diode electrically contacts the same wire or electrode located between the diodes). With this configuration, the two diodes can share the wire between them and still not have a read or write disturb issue.

A monolithic three dimensional memory array formed above a substrate comprises at least a first memory level formed at a first height above the substrate and a second memory level formed at a second height different from the first height. Three, four, eight, or indeed any number of memory levels can be formed above the substrate in such a multilevel array.

In summary, a method to make germanium pillar devices by the selective deposition of Ge or Ge rich SiGe into openings etched in an insulating layer was described. By filling the openings with the semiconductor pillars, several difficulties with the prior subtractive method are overcome and eight process steps can be eliminated in a four layer device. For example, the high aspect ratio oxide gap fill between the pillars is omitted which allows the deposition of simple blanket oxide films with good uniformity. Taller germanium pillars up to 8 microns in height can be fabricated in the deep openings in the insulating layer. The tall diodes reduce reverse leakage in vertical devices. Furthermore, the alignment of different layers is easier. All layers can align to a primary alignment mark without intermediate open frame etches.

Based upon the teachings of this disclosure, it is expected that one of ordinary skill in the art will be readily able to practice the present invention. The descriptions of the various embodiments provided herein are believed to provide ample insight and details of the present invention to enable one of ordinary skill to practice the invention. Although certain supporting circuits and fabrication steps are not specifically described, such circuits and protocols are well known, and no particular advantage is afforded by specific variations of such steps in the context of practicing this invention. Moreover, it is believed that one of ordinary skill in the art, equipped with the teaching of this disclosure, will be able to carry out the invention without undue experimentation.

The foregoing details description has described only a few of the many possible implementations of the present invention. For this reason, this detailed description is intended by way of illustration, and not by way of limitations. Variations and modifications of the embodiments disclosed herein may be made based on the description set forth herein, without departing from the scope and spirit of the invention. It is only the following claims, including all equivalents, that are intended to define the scope of this invention.

What is claimed is:

1. A method of making a pillar device, comprising:
   providing an insulating layer having an opening, wherein titanium nitride, titanium tungsten or tungsten nitride is exposed in the opening in the insulating layer; and
   selectively depositing germanium or germanium rich silicon germanium semiconductor material into the opening to form the pillar device.

2. The method of claim 1, further comprising depositing a silicon seed layer on the titanium nitride, titanium tungsten or tungsten nitride.

3. The method of claim 2, wherein the silicon seed layer is deposited by chemical vapor deposition at a temperature below 440° C.

4. The method of claim 2, wherein the semiconductor material is selectively deposited on the seed layer.

5. The method of claim 4, the semiconductor material is selectively deposited by chemical vapor deposition at a temperature below 440° C.

6. The method of claim 1, further comprising:
   forming the titanium nitride, titanium tungsten or tungsten nitride pattern over a substrate;
   forming an insulating layer on the titanium nitride, titanium tungsten or tungsten nitride pattern; and
   forming the opening in the insulating layer to expose the titanium nitride, titanium tungsten or tungsten nitride pattern.

7. The method of claim 1, further comprising:
   forming the insulating layer over a substrate;
   forming the opening in the insulating layer; and
   selectively forming a titanium nitride, titanium tungsten, or tungsten nitride pattern in the opening.

8. A method of making a pillar diode, comprising:
   forming a titanium nitride pattern over a substrate; and
   forming an insulating layer on the titanium nitride pattern;
   forming an opening in insulating layer to expose the titanium nitride pattern;
   forming a silicon seed layer in the opening on the titanium nitride pattern;
   selectively depositing a first conductivity type germanium or germanium rich silicon germanium semiconductor material on the silicon seed layer in the opening;
   selectively depositing intrinsic germanium or germanium rich silicon germanium semiconductor material on the first conductivity type germanium or germanium rich silicon germanium semiconductor material; and
   implanting second conductivity type dopant into an upper portion of the intrinsic first conductivity type germanium or germanium rich silicon germanium semiconductor material semiconductor material to form a p-i-n diode.

9. The method of claim 8, wherein the semiconductor material is germanium.

10. The method of claim 8, wherein the semiconductor material is germanium rich silicon germanium.

11. The method of claim 8, further comprising forming an antifuse dielectric layer on the diode or under the diode.

12. The method of claim 1, wherein the semiconductor material is germanium.

13. The method of claim 1, wherein the semiconductor material is germanium rich silicon germanium.

14. The method of claim 1, wherein the pillar device comprises a diode.

15. The method of claim 14, wherein the step of selectively depositing germanium or germanium rich silicon germanium semiconductor material into the opening comprises selectively depositing a first conductivity type germanium or germanium rich silicon germanium semiconductor material.

16. The method of claim 15, further comprising:
   selectively depositing intrinsic germanium or germanium rich silicon germanium semiconductor material into the opening on the first conductivity type material; and implanting second conductivity type dopants into an upper portion of the intrinsic germanium or germanium rich silicon germanium semiconductor material to form a p-i-n diode.

17. The method of claim 15, further comprising:

selectively depositing intrinsic germanium or germanium rich silicon germanium semiconductor material into the opening on the first conductivity type semiconductor material; and selectively depositing a second conductivity type germanium or germanium rich silicon germanium semiconductor material in the opening on the intrinsic germanium or germanium rich silicon germanium semiconductor material to form a p-i-n diode.

18. The method of claim 14, further comprising forming an antifuse dielectric layer on diode or under the diode.

19. The method of claim 14, wherein the pillar device is a nonvolatile memory device.

20. A method of making a pillar device, comprising:

forming an insulating layer over a substrate;

patterning the insulating layer to form an opening in the insulating layer;

forming a titanium nitride, titanium tungsten or tungsten nitride pattern over the substrate, prior to the step of forming the insulating layer, wherein the titanium nitride, titanium tungsten or tungsten nitride pattern is exposed in the opening; and selectively depositing germanium or germanium rich silicon germanium semiconductor material into the opening to form the pillar device.

21. The method of claim 20, wherein the semiconductor material is germanium.

22. The method of claim 20, wherein the semiconductor material is germanium rich silicon germanium.

23. The method of claim 20, wherein the pillar device comprises a diode.

24. The method of claim 23, wherein the step of selectively depositing germanium or germanium rich silicon germanium semiconductor material into the opening comprises selectively depositing a first conductivity type germanium or germanium rich silicon germanium semiconductor material.

25. The method of claim 24, further comprising:

selectively depositing intrinsic germanium or germanium rich silicon germanium semiconductor material into the opening on the first conductivity type material; and implanting second conductivity type dopants into an upper portion of the intrinsic germanium or germanium rich silicon germanium semiconductor material to form a p-i-n diode.

26. The method of claim 24, further comprising:

selectively depositing intrinsic germanium or germanium rich silicon germanium semiconductor material into the opening on the first conductivity type semiconductor material; and selectively depositing a second conductivity type germanium or germanium rich silicon germanium semiconductor material in the opening on the intrinsic germanium or germanium rich silicon germanium semiconductor material to form a p-i-n diode.

27. The method of claim 23, further comprising forming an antifuse dielectric layer on diode or under the diode.

28. The method of claim 23, wherein the pillar device is a nonvolatile memory device.

29. The method of claim 20, further comprising depositing a silicon seed layer on the substrate.

30. The method of claim 29, wherein the silicon seed layer is deposited by chemical vapor deposition at a temperature below 440° C.

31. The method of claim 29, wherein the semiconductor material is selectively deposited on the seed layer.

32. The method of claim 31, the semiconductor material is selectively deposited by chemical vapor deposition at a temperature below 440° C.

33. A method of making a pillar device, comprising:

forming an insulating layer over a substrate;

patterning the insulating layer to form an opening in the insulating layer and expose the substrate in the opening;

selectively forming a titanium nitride, titanium tungsten, or tungsten nitride pattern in the opening, prior to a step of selectively depositing germanium or germanium rich silicon germanium semiconductor material; and selectively depositing the germanium or germanium rich silicon germanium semiconductor material into the opening to form the pillar device.

* * * * *